US005132942A

United States Patent [19]

Cassone

[11] Patent Number: 5,132,942

[45] Date of Patent: Jul. 21, 1992

[54] LOW FREQUENCY ELECTROACOUSTIC TRANSDUCER

[76] Inventor: Alphonse Cassone, 5686 East Big Sea, Las Vegas, Nev. 89110

[21] Appl. No.: 367,055

[22] Filed: Jun. 16, 1989

[51] Int. Cl.[5] ........................ H04R 17/00; H01L 41/08

[52] U.S. Cl. .................................... 367/159; 367/168; 310/334; 310/369; 310/26; 29/25.35; 29/594

[58] Field of Search ................. 310/337, 339, 369, 26, 310/334; 367/155, 156, 159, 162, 165, 168; 29/25.35, 594, 595

[56] References Cited

U.S. PATENT DOCUMENTS

| | | | |
|---|---|---|---|
| 2,257,997 | 10/1989 | Barnes | 55/159 |
| 2,812,452 | 11/1957 | Harris | 367/159 |
| 2,880,404 | 3/1959 | Harris | 367/159 |
| 2,928,069 | 3/1960 | Petermann | 367/159 |
| 3,109,721 | 11/1963 | Zenner | 55/159 |
| 3,200,567 | 8/1965 | May | 55/159 |
| 3,284,762 | 11/1966 | Kompanek | 367/159 |
| 3,325,780 | 6/1967 | Horan | 367/157 |
| 3,353,150 | 11/1967 | Jacox | 367/159 |
| 4,076,617 | 2/1978 | Bybel | 210/19 |
| 4,156,824 | 5/1979 | Pence, Jr. | 310/321 |
| 4,220,887 | 9/1980 | Kompanek | 310/334 |
| 4,280,823 | 7/1981 | Szonntagh | 55/15 |
| 4,477,357 | 10/1984 | Sittenfield | 210/748 |
| 4,483,695 | 11/1984 | Covey, Jr. | 55/159 |
| 4,651,044 | 3/1987 | Kompanek | 310/323 |
| 4,673,512 | 6/1987 | Schram | 210/748 |
| 4,774,427 | 9/1988 | Plambeck | 310/321 |
| 4,901,293 | 2/1990 | Kuhn | 367/168 |

*Primary Examiner*—Brian S. Steinberger

[57] ABSTRACT

This invention concerns a low frequency, high energy output electroacoustic transducer. It utilizes a vibratory unit formed of a stack of hollow ceramic cylinders about which is fitted a resilient metal sleeve. The metal sleeve is tensioned outwardly during assembly of the unit so that, upon relaxation, it will fit about the stack as tightly as possible. To further make the stack and sleeve integral, a bonding material is placed between the two. A gap in the sleeve serves as a cutting guide for gapping the stack. Air backing is used to further increase the energy output of the transducer.

13 Claims, 3 Drawing Sheets

FIG. 4

LOW FREQUENCY ELECTROACOUSTIC TRANSDUCER

BACKGROUND OF THE INVENTION

Electroacoustic transducers are now widely used in many commercially important and industrial applications. Included among these uses are seismic oil exploration, ship navigation, loudspeaker components, medical massage, vibratory oil recovery from shale, and chemical waste and emulsion separation. Scientists and researchers have continually improved the efficiency of these devices, but low frequency, low mechanical Q transducers have proven especially difficult to design.

Modern transducers often utilize the piezoelectric effect for converting electrical energy to acoustic or sonic energy. The piezoelectric effect, now well known and well understood, is a property of certain ceramic and other materials. When such a material is properly configured, an electrical charge causes it to distort.

An alternating current applied to the material produces mechanical vibrations, in turn producing acoustic waves. Conversely, a piezoelectric element can serve as an acoustic or sonic detector or receiver, converting received acoustic energy to electrical pulses.

Piezoelectric elements, therefore, are especially well-suited to form the vibratory driving elements in electroacoustic transducers. The resonant frequency and amplitude of the transducer's output is determined by such factors as the choice of construction materials, the dimensions of the transducer, the type of piezoelectric crystal chosen and the input signal amplitude.

It is quite important for many applications that the transducer be reasonably compact and sturdy. They are often used in the field, under water and in locales where repair or replacement is not possible.

A particularly important use of electroacoustic transducers is the treatment of chemical wastes and the dispersal of emulsions. One of the initial steps in waste disposal and recycling is the removal of water from the solid waste constituents. Acoustic energy has proven useful for this, as well as for removing solid particles from filters and screens. Similarly, the breaking up of water-oil emulsions, as occur in oil spills, can be achieved through the application of acoustic energy. Substantial power outputs are required for applications such as these, however, which has not previously been available from these devices.

Conventional transducer technology is represented and explained in numerous prior art patents, such as U.S. Pat. No. 4,651,044, to Komanek; U.S. Pat. No. 4,076,617, to Bybel; and U.S. Pat. No. 2,812,252, to Harris. Many of the above-described applications for transducers are explained in these and other patents.

SUMMARY OF THE INVENTION

This invention is directed to a simply constructed electroacoustic transducer capable of operating at high efficiency while resonating at a low frequency. The transducer of this invention is rugged enough for the hardest use, as a result of its construction and waterproofing. In addition, it resonates at frequencies as low as desired, with a high power, omnidirectional radiation pattern. In normal or typical applications of the transducer, however, resonant frequencies of between 500 and 1,000 Hertz are generated.

This transducer of this invention may be formed with conventional piezoelectric ceramic materials. In addition, piezoelectric materials now under development, such as rare earths, could equally as well be used in its construction.

This invention includes an arrangement of hollow piezoelectric cylinders, placed one atop another, to form a piezoelectric stack. As will be explained, the stack is tightly contained within a resilient metal sleeve. The sleeve and the cylinders forming the stack, therefore, vibrate together as a unit when electric pulses are applied across the cylinders forming the stack.

The interior space within the piezoelectric stack is filled with air or with a commercially available expandable foam (air entraining) material. The air filling provides a medium that reflects interiorly directed waves. This is referred to in the acoustic transducer technology as "air backing." By reliance on air backing rather than free flooding, in which the transducer interior is filed with a medium other than air, acoustic efficiency is enhanced.

As mentioned, a certain amount of air backing is obtained from the entrained air in the expandable foam. The primary purpose of filling the interior of the transducer with foam, however, is to lower the mechanical Q of the acoustic generating system. The lower the Q of the system, the wider the frequency range of the acoustic output.

The piezoelectric stack and the surrounding metal sleeve are equal in length. A gap or slot of narrow width is formed in both the stack and the sleeve, and extends axially along their lengths. The sleeve gap is coextensive, and aligned, with the gap in the piezoelectric stack. The combination of the piezoelectric stack and the sleeve, therefore, together form a highly stylized horseshoe, capable of vibrating like a tuning fork.

The width of the gap opening (its circumferential length) affects the resonant frequency of the transducer, as does the piezoelectric wall thickness and the diameter of the stack. The piezoelectric cylinder is polarized radially, i.e., from the interior surface of the ceramic cylinder to its outside surface. The electrical pulses needed to cause vibrations of the cylinder are, thus, applied between the interior of the stack and the sleeve.

In deep underwater uses of the transducer, the hydrostatic pressure on the device can be considerable. To withstand this pressure, a gap shield is provided. In addition, the transducer is encapsulated or potted in a silicone, urethane or equivalent waterproofing compound. The potting material may also be selected to withstand high temperatures, as when the transducer is placed deep underground.

Hydrostatic pressure, however, can push the waterproofing encapsulant into the transducer's interior, and thereby "clamp" the piezoelectric stack (keep it from vibrating). To avoid this, the gap extending through both the stack and the sleeve can be angled away from the radial direction. An angle of about 60 degrees has proven satisfactory, although other angles are suitable.

An object of the invention, therefore, is to provide a transducer capable of providing a high acoustical output at a low resonant frequency.

Another object of the invention is to provide a waterproofed transducer resistant to extreme hydrostatic pressure, for deep sea applications.

A further object of the invention is to provide a transducer possessing high efficiency in converting electrical to acoustical energy, while providing a particular frequency or frequency range with precision.

Another object of the invention is to provide a transducer able to efficiently disperse emulsions, chemical and other wastes, and the like for recycling and environmental enhancement.

A further object of the invention is to provide a method of assembly for a high output, low resonant frequency transducer.

A still further object of the invention is to provide a system and method for dispersing, emulsions, chemical and other wastes, and the like for recycling or improvement of the environment.

These and other objects and advantages of the invention will be made clear to those of ordinary skill in the art by the description of the invention to follow. The invention is described below with reference to the accompanying drawings.

BRIEF DESCRIPTION OF THE DRAWINGS

In FIG. 3, the gap is oriented at an angle of approximately 60 degrees from the radial direction.

DETAILED DESCRIPTION OF THE PREFERRED EMBODIMENTS

The transducer of this invention includes a sleeve 4 of flexible metal, inside of which is contained a stack of hollow piezoelectric cylinders. Steel and aluminum have proven well suited for forming these sleeves, but other metals, alloys or composites possessing the necessary flexibility and electrical conductivity (as will be explained) can be used.

It is important to keep the exterior dimensions of the transducer as small as possible, consistent with obtaining adequate output power. For this, the transducer should contain as much piezoelectric material as possible. A typical transducer might be approximately 12" high, with an outside diameter of 3.3", although larger or smaller transducers are possible.

Figure 1:
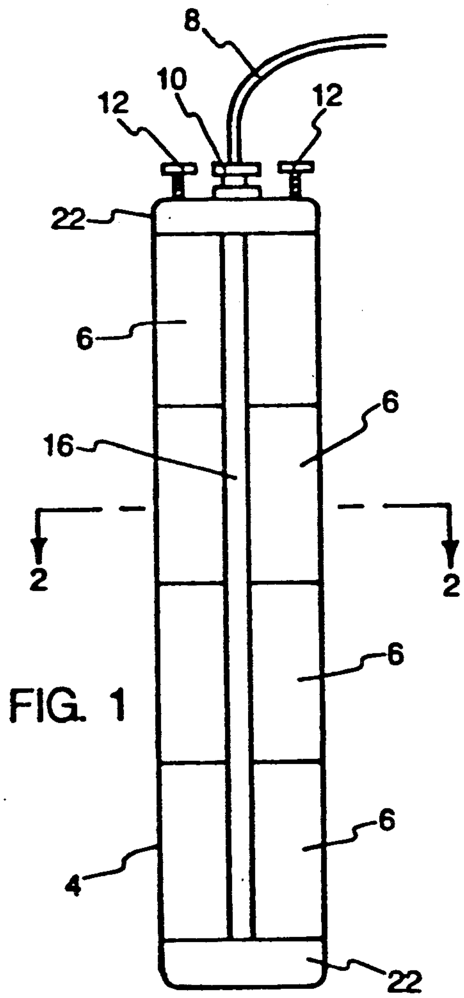
FIG. 1 is a side elevation of the transducer of this invention, depicting its overall configuration and components when assembled.

Manufacturing techniques, however, do not permit the manufacture of a single piezoelectric cylinder of large dimensions. The stack used in this invention, therefore, is formed of a series of cylinders about 2" to 3" in height. FIG. 1 shows four such cylinders 6, arranged end to end to form the transducer cylinder. If the transducer were small enough, however, a single cylinder could be used.

A coaxial power supply line 8, connected to the interior of the transducer and the sleeve 4 through terminal 10, provides the alternating current needed to make the piezoelectric stack vibrate. As is well known in this technology, the power source is connected between the interior of the cylindrical stack and the metal sleeve. The activating potential applied to the transducer, therefore, is radially directed across each piezoelectric cylinder in the stack.

A pair of lift members 12 facilitate the handling of the transducer, especially when submerging it in a body of water or down a well. These lifts may be configured in various ways, depending on the transducer's intended use. Also, the number of lifting elements and their positions may be varied.

Figure 2:
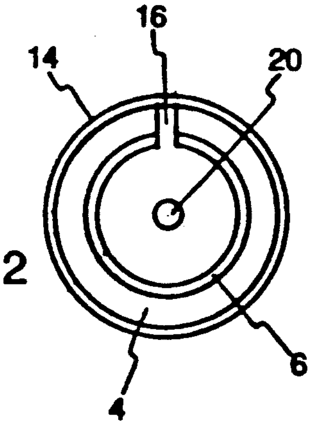
FIG. 2 is a cross-section taken along lines 2—2 of FIG. 1. This cross-section shows a radially directed gap extending through both the piezoelectric cylinder and the surrounding sleeve.

Referring to FIG. 2, the cross-section of the transducer can be seen to include a metal sleeve 4, and a piezoelectric stack 6. A gap or slot 16 extends along the axial length of the transducer. The interior of the transducer, i.e., the space within the piezoelectric stack, is air-filled or for acoustic radiation of a lower Q, filled with an expandable (air entraining) foam.

The exterior of the transducer is potted or encapsulated in a waterproofing silicone, urethane or similar material 14. This encapsulation, not shown for clarity in FIG. 1, can be carried out by dipping, split-apart molding or other conventional potting techniques.

A solid rod 20 (FIG. 2) extends through the center of the piezoelectric stack, spanning the entire axial length of the transducer. The rod is terminated at each end by its bolting to end caps 22, thereby providing structural rigidity to the transducer.

The end caps 22 themselves do not actually contact the ends of the sleeve 4. Rather, they are spaced very slightly apart from the ends of the piezoelectric stack by means of compressible spacers or rings. These spacers, which may be made of Nylon or other suitable materials, enable the stack to vibrate mechanically, without clamping by the end caps.

The tightness of fit between the piezoelectric stack and the sleeve is crucial to the acoustic radiating efficiency of the transducer. A special technique is, accordingly, employed to assure this tightness.

The inner diameter of sleeve 4 is slightly smaller than the outer diameter of the stack. In assembling the transducer, therefore, the slot or circumferential gap 16 in the sleeve enables it to be opened enough under tension for fitting about the outside of the stack. The flexibility of the sleeve, once in place, returns it to continuing tight contact with the stack.

This method of forming the transducer stack provides a very high coupling coefficient. To secure the sleeve to the stack as tightly as possible, however, a bonding material is used between the two. The exterior of the ceramic cylinders and the interior walls of the sleeve can even be scored to provide better bonding As a result of this closeness of contact, the sleeve and the stack vibrate together as a unit to produce acoustical waves in response to the energization of the piezoelectric stack. The encapsulating material must be elastic enough to withstand the mechanical vibrations of the sleeve.

Exact alignment of the gaps in the sleeve and the stack is obviously critical for the efficient generation of acoustic energy by the transducer. Once the sleeve is in place around the piezoelectric stack, its gap 4 forms a guide or template for cutting the gaps in each cylinder in the stack. In this way, exact alignment between the gaps in the piezoelectric cylinders and the sleeve is obtained.

An encapsulating or potting material encloses the exterior of the transducer, including the gap 16, to make the assembled transducer watertight. To guard against the flow of this potting material into the interior of the transducer during the potting process, the openings and spaces in the transducer are first sealed with a soft, viscous material. Rubber latex has proven satisfactory for this purpose.

Figure 3:
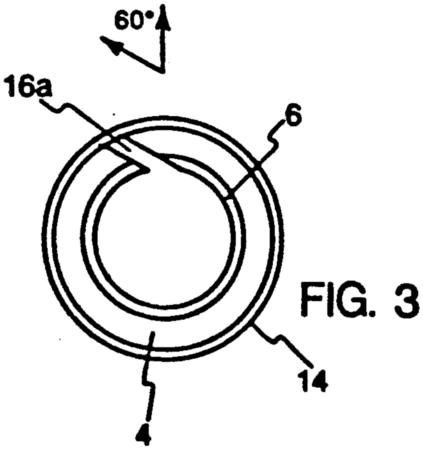
FIG. 3 illustrates a modification of the piezoelectric cylinder shown in cross-section in FIG. 2.

The embodiment illustrated in FIG. 3 utilizes a gap 16*a* oriented in a direction approximately 60 degrees away from the radial direction R. This gap eliminates or minimizes "clamping" of the transducer by the entry of the encapsulant into the gap. Clamping occurs in deep water exploration when the hydrostatic pressure of the water forces the encapsulant inward. Encapsulation of the transducer can also be utilized to contain or entrap air within the interior of the piezoelectric stack for air backing.

Figure 4:
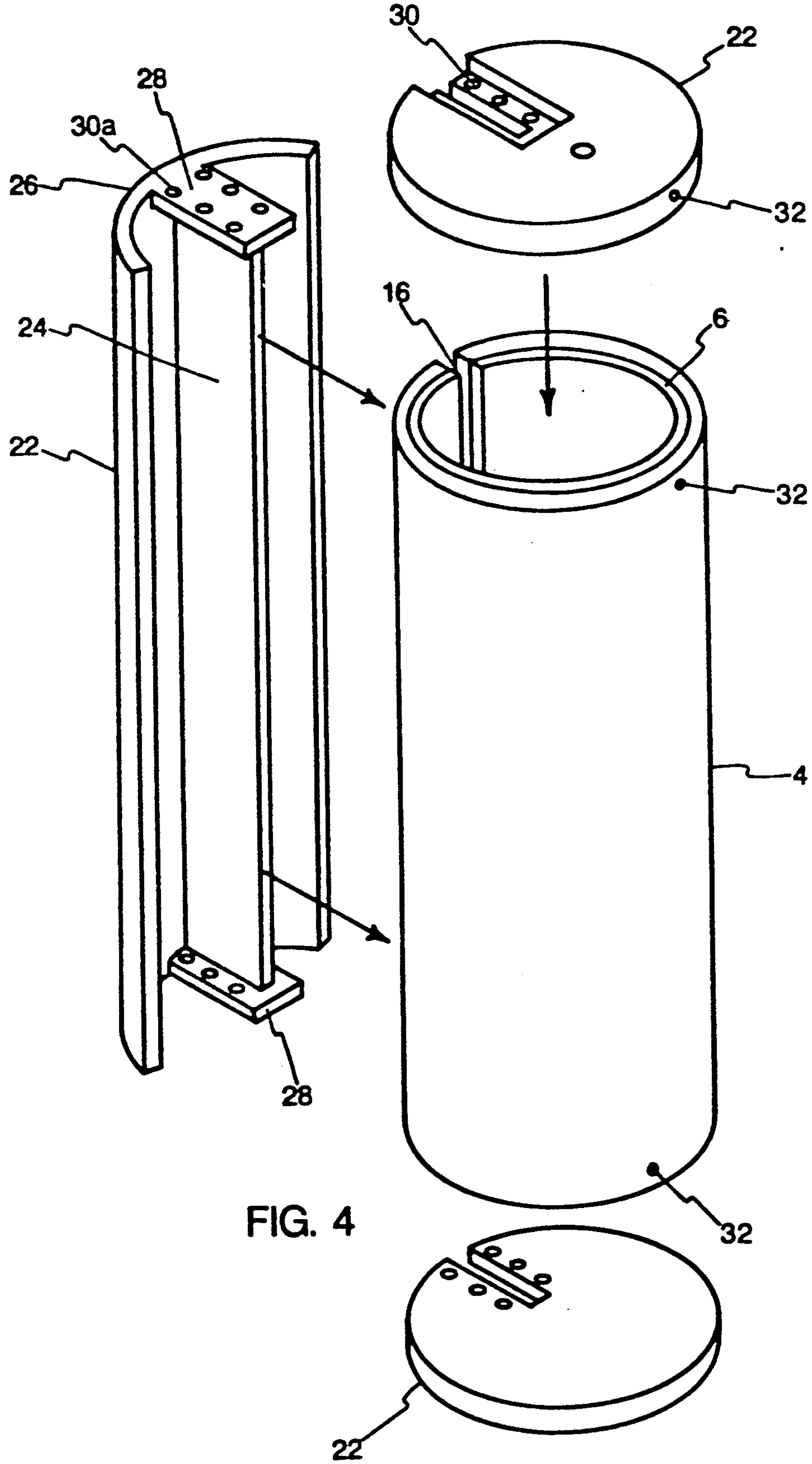
FIG. 4 is an exploded perspective view of still another embodiment of the invention, including a gap or slot shield.

In the embodiment of the invention illustrated in FIG. 4, a gap shield is used for structural integrity of the transducer under extreme hydrostatic pressure. In some commercial and exploratory uses, pressures as great as 1,000 psi can be encountered.

The shield 22 includes a bar 24 of a length equal to that of the piezoelectric stack. This bar is attached to arcuate shield plate 26, and carries a bolting plate 28 at each end. For maximum strength, the shield plate, bar and bolting plates are made as an integral unit.

The end caps 22 contain bolt holes 30 corresponding to and aligned with bolt holes 30*a* in bolting plates 28. The radius of curvature of the shield plate 26 is equal to that of the sleeve 4. The bar 24 extends through the gap 16 into the interior of the piezoelectric stack.

The bar has a thickness slightly less than the circumferential length of the gap. The stack and sleeve may, thus, freely vibrate without the edges of the gap touching the sides of the bar. Communicating bolt holes 32 and 32' in the end caps 22 and the sleeve, respectively, enable a plate to be bolted thereto and retain the caps in position on the sleeve. This construction imparts rigidity without the need for rod 20, the bar 24 serving the same purpose as the rod. The bar may be coated with a dielectric material to prevent arcing between it and the gap edges.

As another aspect of the piezoelectric effect, the transducer constituting this invention can be used as a receiver of acoustic energy from another transducer and transform this energy into electrical pulses. This effect permits use of the device in cross-well oil or mineral exploration.

In such exploration, a transducer is lowered into an oil reserve or well and energized to transmit a acoustic signal. A second transducer, remotely located from the first, receives this signal. By analyzing the received signal, the nature of the intervening geological formation can be ascertained.

In certain uses, including cross-well exploration or waste recycling, a single transducer, no matter how efficient, cannot always provide a sufficiently strong acoustic signal or the desired information. Accordingly, transducers may be positioned in arrays. The geometry of any array, however, should call for the spacing of the transducers no more than one-half wavelength from each other. Otherwise, adequate acoustic power may not be available for the system.

Figure 5:
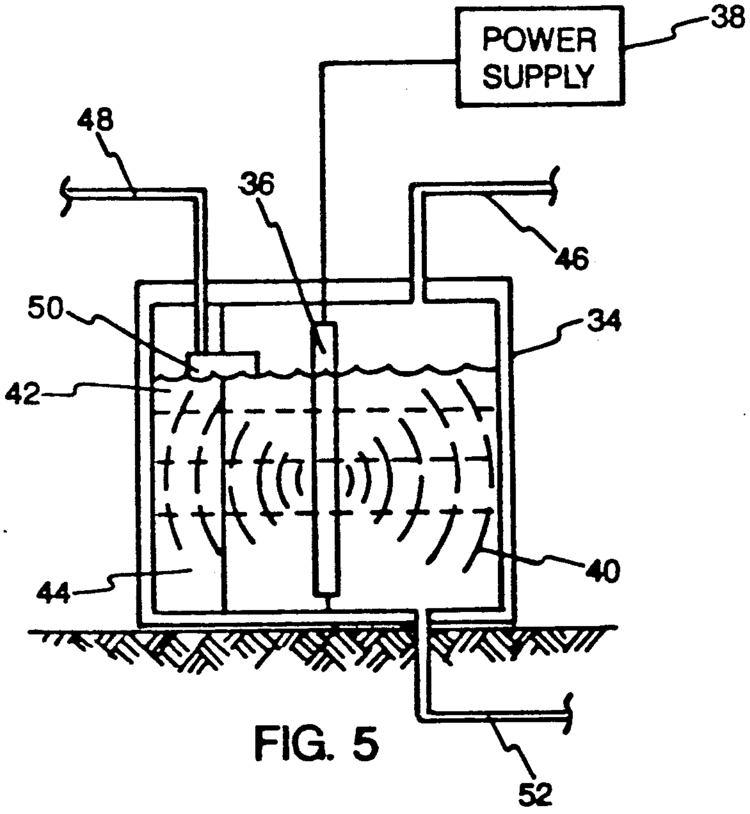
FIG. 5 schematically illustrates a system for dispersing waste chemicals, using the invention.
Figure 6A:
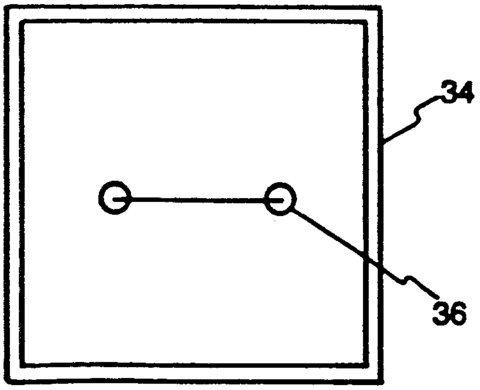
FIGS. 6*a* and 6*b* illustrate an array of transducers for use in sytems such as that of FIG. 5.
Figure 6B:
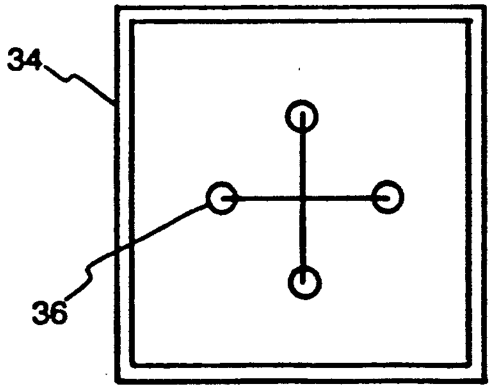

FIG. 5 depicts a waste dispersal system, one important commercial application for a low frequency, low Q, transducer. Waste to be dispersed is introduced into an acoustic treatment chamber 34 through a non-illustrated inlet. A transducer 36 of appropriate size and power output is positioned within the chamber. Depending on chamber size and power output demands, an array of transducers would be used. FIGS. 6*a* and 6*b* illustrate typical arrays.

Upon energizing the transducer by means of power supply 38, low frequency acoustic waves 40 are generated in the chamber. These waves cause the waste to separate into layers 42. In this illustration, the waste separates into three such layers. The residual solids 44 sink to the bottom of the chamber. The waste ingredients separate into layers according to their relative weights or densities. A gas vent 46 may be added to the system.

Each layer of waste ingredients or components is removed one after the other through a waste recovery vacuum line 48 to which is connected an adjustable siphon float 50 Solid waste 44 is removed from the chamber through residual solids drain line 52.

The transducer of this invention possesses several unique properties. It is capable of producing a high acoustic output at a low frequency, with a low mechanical Q (below 25). It is highly efficient, especially at frequencies below 1,000 Hertz. The output waves can reach sound pressure levels greater than 200 dB, a far greater power output than can be produced by ultrasound (high output frequency) transducers. The transducer's low impedance further increases its efficiency.

The foregoing description is considered illustrative only. Numerous modifications will readily occur to those skilled in this technology. Accordingly, the invention is not intended to be limited to the exact details set out above. Rather, all reasonable equivalents, modifications and details are considered to fall within the scope of the invention.

What is claimed is:

1. An electroacoustic transducer, comprising:
   - a plurality of hollow cylinders formed of piezoelectric material, the cylinders being stacked one atop the other to form a piezoelectric stack;
   - a resilient metal sleeve having an inner and an outer diameter, the sleeve being positioned around the outside face of the stack, the inner diameter of the sleeve in its relaxed state being slightly less than the outer diameter of the stack of hollow cylinders;
   - a bonding material between the sleeve and the stack;
   - aligned gaps in the sleeve and the stack, these gaps having the same width as and extending along the entire axial lengths of the sleeve and the stack;
   - means for applying electrical pulses between the interior of the stack and the sleeve;
   - and potting means for sealing the exterior of the sleeve from the atmosphere or the environment and retaining air within the transducer;
   - whereby the stack and sleeve form a vibratory unit to produce an acoustic output of 1000 CPS or less.

2. The electroacoustic transducer of claim 1, in which an expanded closed cell foam is contained within the interior of the transducer to reflect sound waves and thereby provide an acoustic output Q of 25 or less.

3. The electroacoustic transducer of claim 1, in which the sleeve is made of steel or aluminum.

4. The electroacoustic transducer of claim 1, in which the piezoelectric cylinder is formed of a piezo ceramic or a rare earth.

5. The electroacoustic transducer of claim 1, further including end caps for enclosing the interior of the cylinder.

6. The electroacoustic transducer of claim 1, in which the aligned gaps extend through the stack and sleeve at an angle not radially directed.

7. The electroacoustic transducer of claim 6, wherein the angle is approximately 60 degrees.

8. The electroacoustic transducer of claim 5, further including a rod extending through the center of the stack and fixedly connected at each end to a cap.

9. The electroacoustic transducer of claim 5, further including resilient spacers positioned between the end caps and the sleeve to avoid contact between the two.

10. The electroacoustic transducer of claim 5, further including a gap shield for providing structural rigidity to the transducer, the shield comprising:

an arcuate shield plate coextensive in length with the stack and having the same radius of curvature;

a bar affixed to, and coextensive in length with, the shield plate, the bar having a thickness slightly less that the circumferential length of the gap; and an end plate at each end of the bar;

wherein the bar is inserted into the gap to thereby position the shield against the vibratory unit and permit the end plates to be fixed to the caps.

11. The electroacoustic transducer of claim 10, wherein the bar is coated with a dielectric material to prevent arcing between it and the edges of the gap.

12. A method of assembling an electroacoustic vibratory unit, comprising the steps of:

(a) forming a plurality of hollow cylinders of piezoelectric material;

(b) arranging the cylinders in a stack;

(c) providing a flexible metal sleeve having an inside diameter slightly less than the outside diameter of the stack and a gap of predetermined width along its length;

(d) placing a bonding material between the outer face of the stack and the inner face of the sleeve;

(e) opening the sleeve enough to position it around the stack, with the bonding material therebetween;

(f) allowing the sleeve to close around the stack by relaxing the tension on the sleeve; and (g) forming a gap in the stack aligned and coextensive with the gap in the sleeve by using the edges of the sleeve gap as a cutting guide.

13. The method of claim 12, in which the piezoelectric cylinders are formed of a piezo ceramic or a rare earth.

* * * * *

UNITED STATES PATENT AND TRADEMARK OFFICE

CERTIFICATE OF CORRECTION

PATENT NO. : 5,132,942

DATED : July 21, 1992

INVENTOR(S) : Alphonse Cassone

It is certified that error appears in the above-indentified patent and that said Letters Patent is hereby corrected as shown below:

Column 1, line 39: the words; elements and - should be added before the word; emulsions.

Column 3, line 2: the word; elements, - should be added before the word; emulsions.

Column 3, line 9: the word; elements, - should be added before the word; emulsions.

Signed and Sealed this

Twenty-first Day of June, 1994

*Attest:*

BRUCE LEHMAN

*Attesting Officer* *Commissioner of Patents and Trademarks*